United States Patent
Tseng et al.

(10) Patent No.: US 9,431,251 B2
(45) Date of Patent: Aug. 30, 2016

(54) SEMICONDUCTOR DEVICE HAVING A DOUBLE DEEP WELL AND METHOD OF MANUFACTURING SAME

(71) Applicant: TAIWAN SEMICONDUCTOR MANUFACTURING COMPANY, LTD., Hsinchu (TW)

(72) Inventors: Hua-Chou Tseng, Hsinchu (TW); Chien-Chih Ho, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/626,259

(22) Filed: Feb. 19, 2015

(65) Prior Publication Data

US 2015/0162198 A1    Jun. 11, 2015

Related U.S. Application Data

(62) Division of application No. 13/913,921, filed on Jun. 10, 2013, now Pat. No. 8,987,825.

(51) Int. Cl.
| | |
|---|---|
| *H01L 29/78* | (2006.01) |
| *H01L 21/266* | (2006.01) |
| *H01L 29/10* | (2006.01) |
| *H01L 21/761* | (2006.01) |
| *H01L 29/66* | (2006.01) |
| *H01L 21/265* | (2006.01) |

(52) U.S. Cl.
CPC ....... *H01L 21/266* (2013.01); *H01L 21/26513* (2013.01); *H01L 21/761* (2013.01); *H01L 29/1079* (2013.01); *H01L 29/66568* (2013.01); *H01L 29/66575* (2013.01); *H01L 29/78* (2013.01)

(58) Field of Classification Search
None
See application file for complete search history.

(56) References Cited

U.S. PATENT DOCUMENTS

| | | |
|---|---|---|
| RE35,486 E | 4/1997 | Bertotti et al. |
| 5,801,420 A | 9/1998 | Fujishima |
| 6,060,742 A | 5/2000 | Chi et al. |
| 6,111,283 A | 8/2000 | Yang et al. |
| 6,573,588 B1 | 6/2003 | Kumamoto et al. |
| 7,151,287 B1 | 12/2006 | Scheffer et al. |
| 7,759,740 B1 * | 7/2010 | Masleid .......... H01L 21/823892 257/371 |
| 7,928,508 B2 | 4/2011 | Yao et al. |
| 8,344,416 B2 | 1/2013 | Sheu et al. |
| 8,488,371 B2 | 7/2013 | Uemura |

(Continued)

FOREIGN PATENT DOCUMENTS

| | | |
|---|---|---|
| WO | 8808617 | 11/1988 |

*Primary Examiner* — Pamela E Perkins
(74) *Attorney, Agent, or Firm* — Hauptman Ham, LLP

(57) ABSTRACT

A method of forming a semiconductor device includes patterning a first mask over a substrate defining a first opening. The substrate includes a first dopant type. The method includes implanting ions having a second dopant type through the first opening to form a first deep well. The method includes patterning a second mask over the substrate defining a second opening. The method includes implanting ions having the second dopant type through the second opening to form a second deep well, wherein an energy for implanting ions to form the second deep well is lower than an energy for implanting ions to form the first deep well. The method includes implanting ions having the first dopant type into the substrate to form a first well, wherein the energy for implanting ions to form the second deep well is greater than an energy for implanting ions to form the first well.

20 Claims, 11 Drawing Sheets

(56) References Cited

U.S. PATENT DOCUMENTS

| | | |
|---|---|---|
| 8,704,279 B2 | 4/2014 | Yeh et al. |
| 2010/0219471 A1 | 9/2010 | Cai |
| 2012/0199874 A1 | 8/2012 | Salcedo et al. |
| 2012/0286359 A1 | 11/2012 | Lin et al. |
| 2013/0122636 A1 | 5/2013 | Chang et al. |
| 2013/0242659 A1 | 9/2013 | Yu et al. |
| 2013/0328103 A1 | 12/2013 | Salcedo |
| 2014/0077300 A1 | 3/2014 | Noel et al. |
| 2014/0198551 A1 | 7/2014 | Louie et al. |
| 2014/0252451 A1 | 9/2014 | Han et al. |
| 2014/0264563 A1 | 9/2014 | Cheng et al. |
| 2015/0069509 A1* | 3/2015 | Lee .................. H01L 29/06 257/343 |

\* cited by examiner

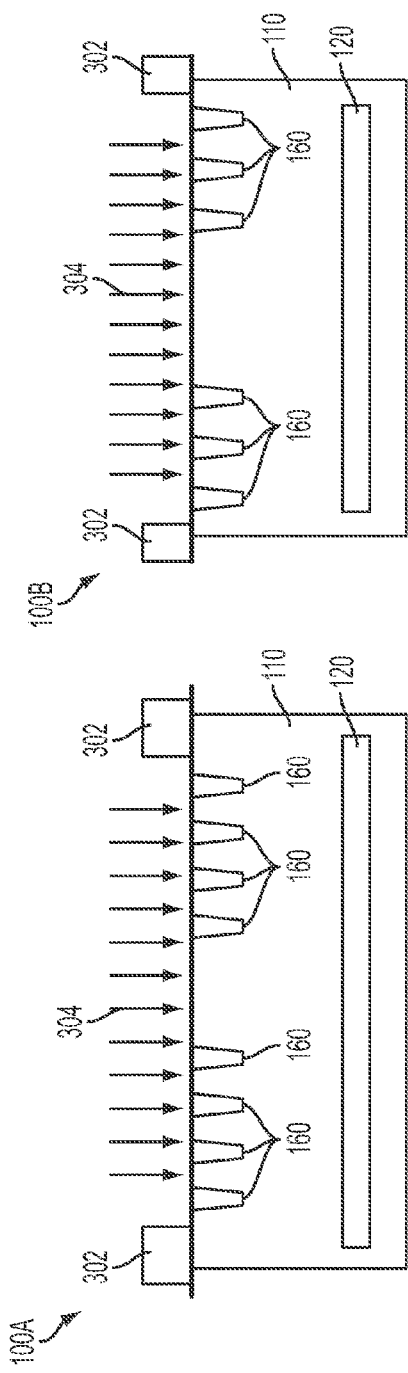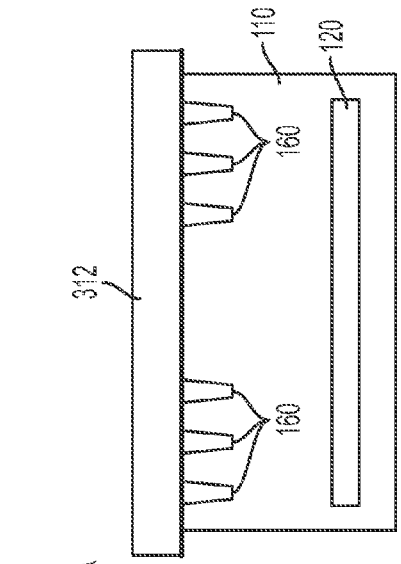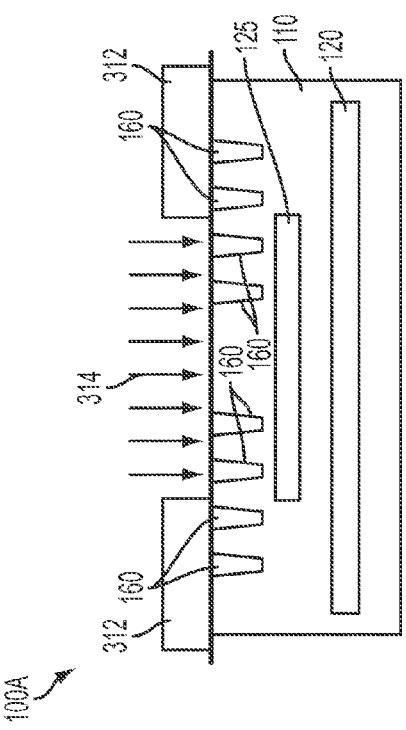

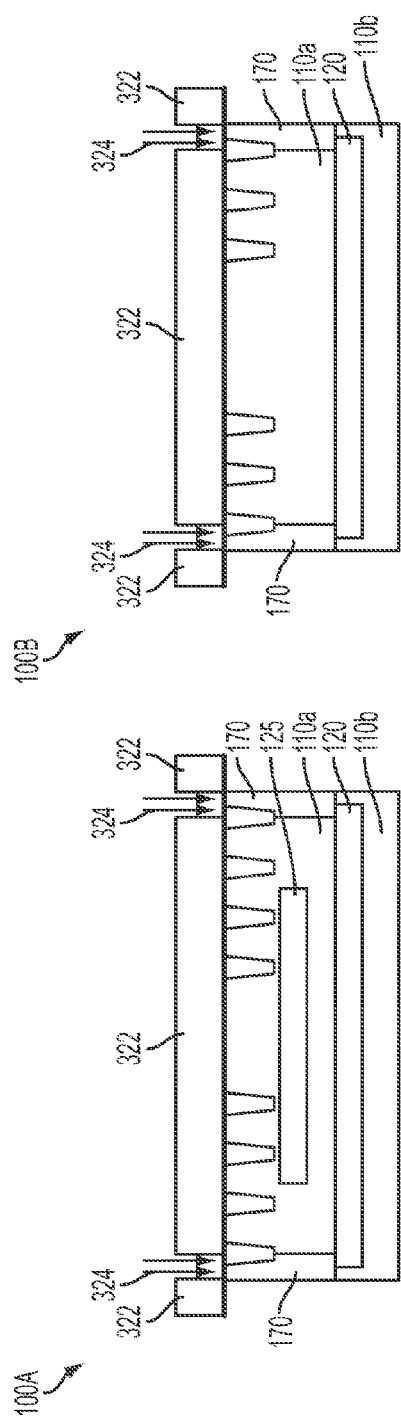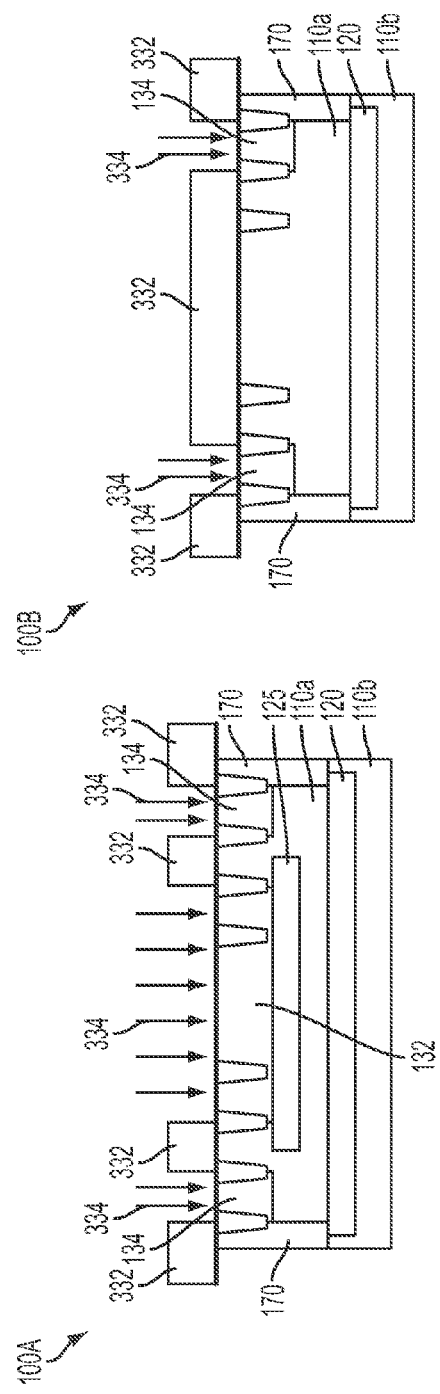

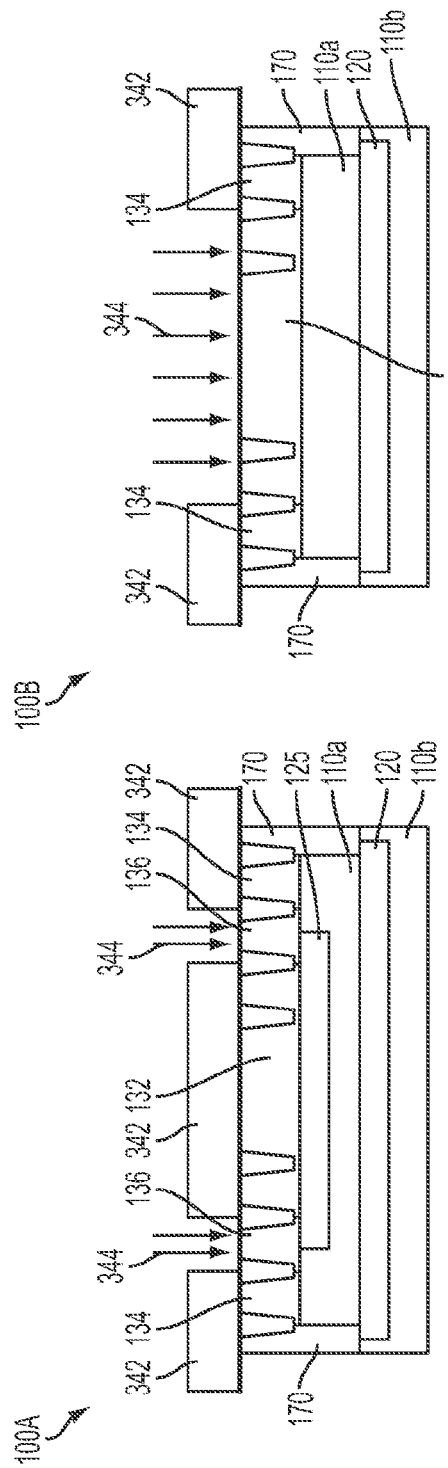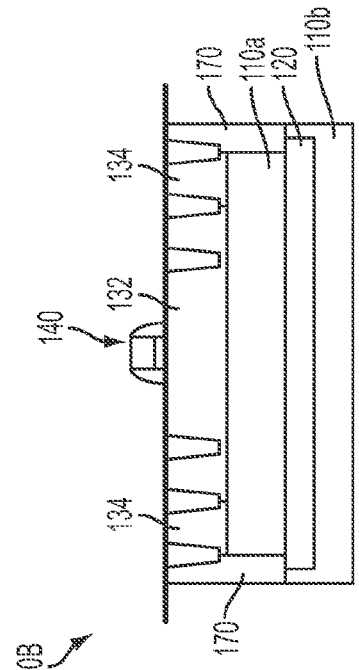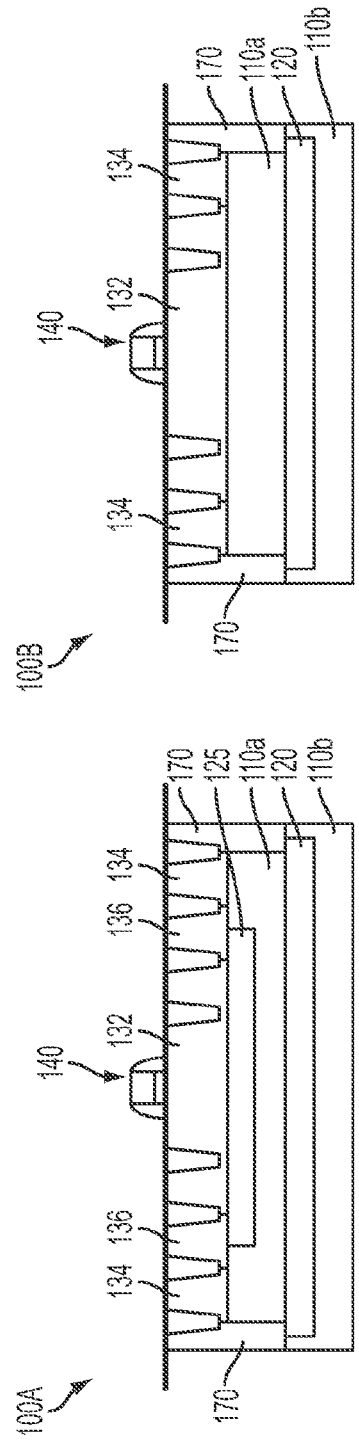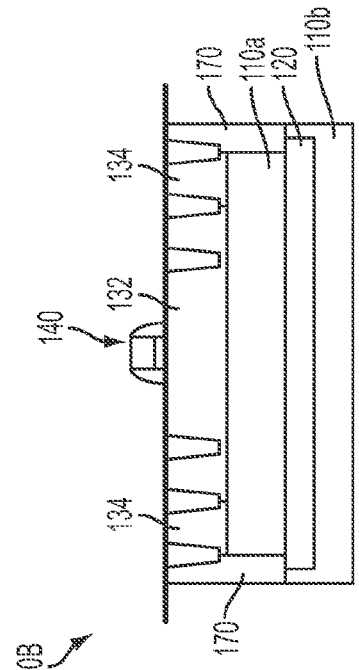

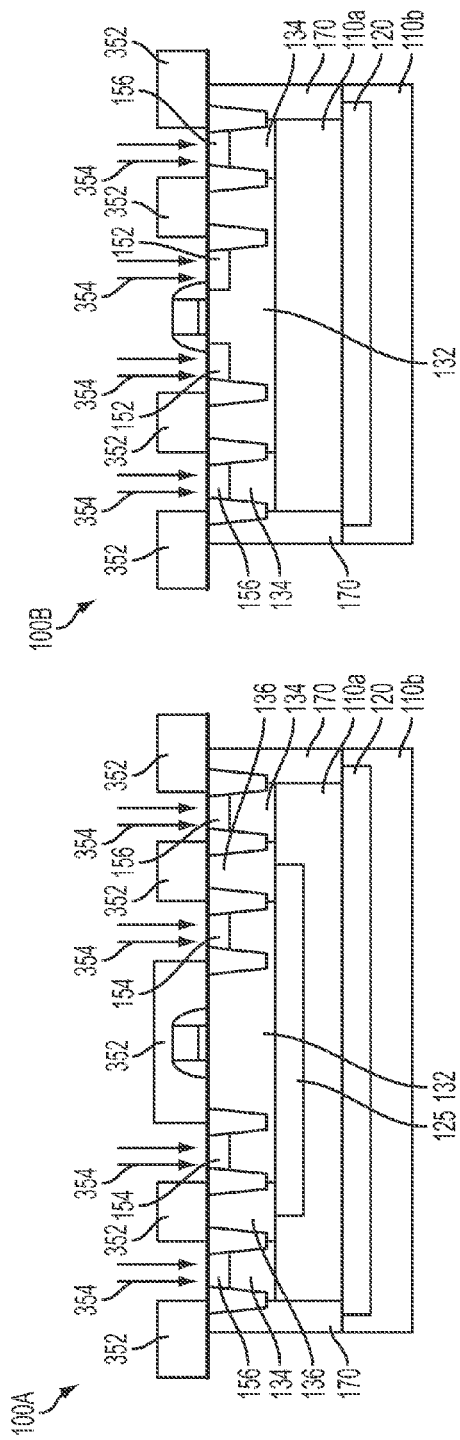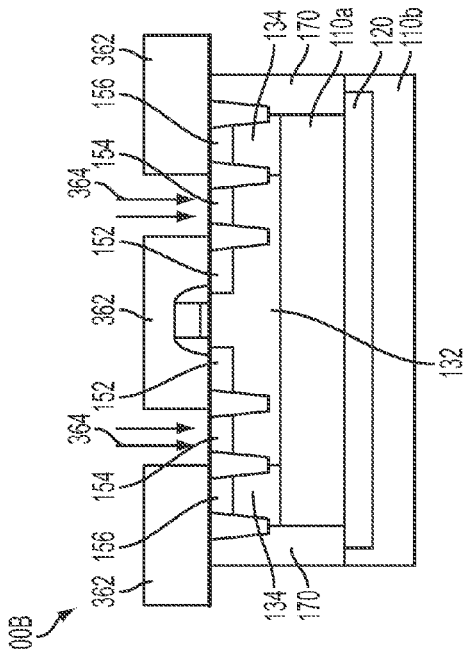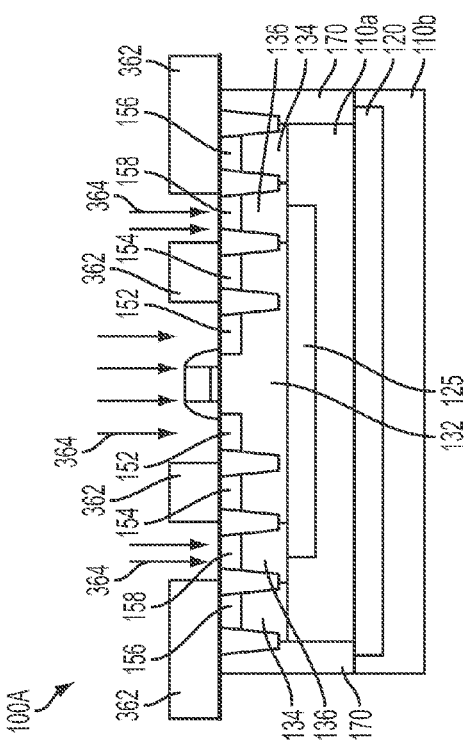

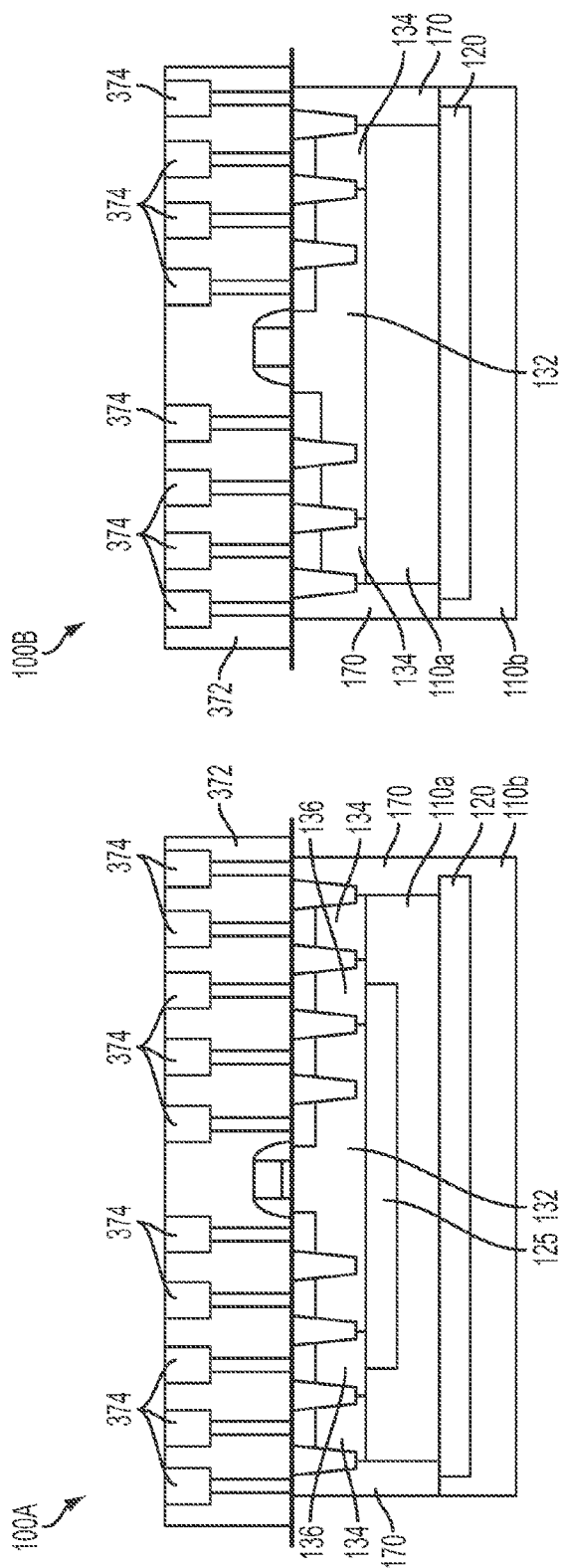

SEMICONDUCTOR DEVICE HAVING A DOUBLE DEEP WELL AND METHOD OF MANUFACTURING SAME

PRIORITY CLAIM

The present application is a divisional of U.S. application Ser. No. 13/913,921, filed Jun. 10, 2013, which is incorporated herein by reference in its entirety.

BACKGROUND

Transistors are used as switches to electrically couple or decouple signals among different nodes. For example, in a mobile communication system capable of transmitting and receiving signals at various carrier frequency bands, an antenna is usually shared by various corresponding Intermediate Frequency (IF) and/or baseband circuits through one or more Radio Frequency (RF) switches. The term "RF" refers to a radio wave having a frequency ranging from about 3 kHz to 300 GHz. When two transistors sharing the same substrate are used as switches, an electrical coupling path is formed between the two transistors through the substrate.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 3A-1 through 3I-2 are cross-sectional views of a semiconductor device at various stages during manufacture in accordance with one or more embodiments.

FIGS. 5A-1 through 5C-2 are cross-sectional views of a semiconductor device at various stages of manufacture in accordance with one or more embodiments.

DETAILED DESCRIPTION

Figure 1A:
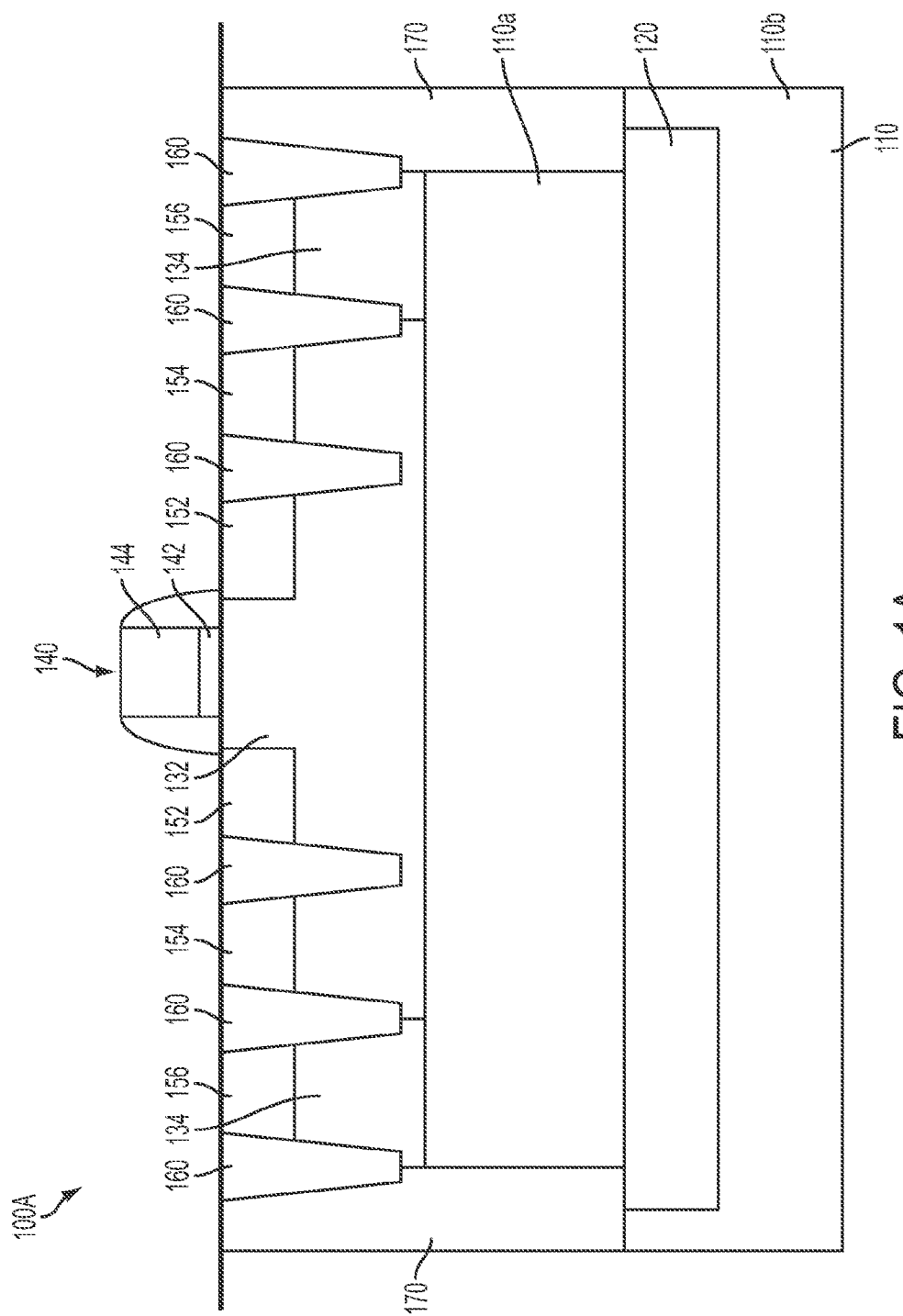
FIG. 1A is a cross-sectional view of a P-type metal oxide semiconductor (PMOS) transistor device having a double deep well in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.), are used for ease of the present disclosure of the relationship of features. The spatially relative terms are intended to cover different orientations of the device including the features.

FIG. 1A is a cross sectional view of a p-type metal oxide semiconductor (PMOS) transistor 100A having a double deep well in accordance with one or more embodiments. PMOS transistor 100A includes a substrate 110 having an upper portion 110a and a lower portion 110b. Between the upper portion 110a and lower portion 110b in substrate 110 is a double deep well 120 having an n-type dopant concentration therein. A first well 132 including an n-type dopant type is in substrate 110 above upper portion 110a. A second well 134 is in substrate 110 above upper portion 110a surrounding first well 132. Second well 134 has a p-type dopant. A gate structure 140 is formed over first well 132. A first heavily doped region 152 including a p-type dopant is in first well 132 surrounding gate structure 140. A second heavily doped region 154 including an n-type dopant is in first well 132 and surrounds first heavily doped region 152. Non-conductive structures 160 separate first heavily doped region 152 from second heavily doped region 154. A third heavily doped region 156 including a p-type dopant is in second well region 134 surrounding second heavily doped region 154. Non-conductive structures 160 separate third heavily doped region 156 from second heavily doped region 154. In some embodiments, a sinker well 170 is in substrate 110 surrounding first well 132; second well 134; and third heavily doped region 156. Sinker well 170 includes n-type dopants. Sinker well 170 is electrically coupled to double deep well 120.

In some embodiments, substrate 110 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 110 is a strained SiGe substrate. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, substrate 110 is a doped substrate. In some embodiments, substrate 110 is a high resistance substrate. In some embodiments, a resistance of substrate 110 is equal to or greater than 1K ohm-cm. If the resistance is less than 1K ohm-cm, current leakage through substrate 110 at high operating voltages causes PMOS transistor 100A to function improperly, in some embodiments. In some embodiments having the high resistance substrate, PMOS transistor 100A increases heat dissipation in comparison with a silicon-on-insulator (SOI) substrate.

In some embodiments, upper portion 110a and lower portion 110b are continuous. In some embodiments, upper portion 110a and lower portion 110b are discontinuous. In some embodiments, upper portion 110a is grown on top of lower portion 110b. In some embodiments, upper portion 110a is grown using an epitaxial process.

Double deep well 120 is formed in substrate 110 and provides a reduced serial capacitance in comparison with PMOS transistor designs which do not include double deep well 120. An interface between double deep well 120 and lower portion 110b; and an interface between double deep well 120 and upper portion 110a form serial capacitors, so that a total substrate capacitance is reduced with respect to a design which does not include double deep well 120.

Double deep well 120 comprises n-type dopants. In some embodiments, the n-type dopants include phosphorus, arsenic or other suitable n-type dopants. In some embodiments, the n-type dopant concentration in double deep well 120 ranges from about $1\times10^{12}$ atoms/cm$^2$ to about $1\times10^{14}$ atoms/cm$^2$. In some embodiments, double deep well 120 is formed by ion implantation. The power of the ion implantation ranges from about 1500 k electron volts (eV) to about 8000 k eV. In some embodiments, a depth of double deep well 120 ranges from about 5 microns (μm) to about 10 μm. In some embodiments, upper portion 110a is grown over double deep well 120. In some embodiments, double deep well 120 is epitaxially grown over bottom portion 110b.

First well 132 is in substrate 110 and has an n-type dopant type. First well 132 is over upper portion 110a. An interface between first well 132 and upper portion 110a forms a capacitor in series with the capacitors at the interfaces of double deep well 120. In some embodiments, the n-type dopant comprises phosphorus, arsenic or another suitable n-type dopant. In some embodiments, a dopant species in first well 132 is the same as a dopant species in double deep well 120. In some embodiments, the dopant species in first well 132 is different from the dopant species of double deep well 120. In some embodiments, first well 132 comprises an epi-layer grown over upper layer 110a. In some embodiments, the epi-layer is doped by adding dopants during the epitaxial process. In some embodiments, the epi-layer is doped by ion implantation after the epi-layer is formed. In some embodiments, first well 132 is formed by doping substrate 110. In some embodiments, the doping is performed by ion implantation. In some embodiments, first well 132 has a dopant concentration ranging from $1\times10^{14}$ atoms/cm$^3$ to $1\times10^{16}$ atoms/cm$^3$. If the dopant concentration is below $1\times10^{14}$ atoms/cm$^3$, first well 132 does not provide sufficient conductivity to form a conductive path below gate structure 140, in some embodiments. If the dopant concentration is above $1\times10^{16}$ atoms/cm$^3$, first well 132 would increase the current leakage, in some embodiments.

Second well 134 is in substrate 110 surrounding first well 132. Second well 134 includes a p-type dopant. In some embodiments, the p-type dopant comprises boron, aluminum or other suitable p-type dopants. In some embodiments, second well 134 comprises an epi-layer grown upper portion 110a. In some embodiments, the epi-layer is doped by adding dopants during the epitaxial process. In some embodiments, the epi-layer is doped by ion implantation after the epi-layer is formed. In some embodiments, second well 134 is formed by doping substrate 110. In some embodiments, the doping is performed by ion implantation. In some embodiments, second well 134 has a dopant concentration ranging from $1\times10^{12}$ atoms/cm$^3$ to $1\times10^{14}$ atoms/cm$^3$. In some embodiments, second well 134 is electrically coupled to upper portion 110a and is usable to bias the substrate 110 at a predetermined voltage level. If the dopant concentration is below $1\times10^{12}$ atoms/cm$^3$, second well 134 does not provide sufficient electrical connection with substrate 110, in some embodiments. If the dopant concentration is above $1\times10^{14}$ atoms/cm$^3$, second well 134 would increase current leakage from first well 132 to substrate 110, in some embodiments.

Gate structure 140 is over a top surface of first well 132. Gate structure 140 includes a gate dielectric layer 142 over a top surface of first well 132. A gate electrode 144 is over gate dielectric 142. Gate structure 140 also includes spacers along sidewalls of gate dielectric layer 142 and gate electrode 144. In some embodiments, gate dielectric layer 142 comprises a high-k dielectric material. A high-k dielectric material has a dielectric constant (k) higher than the dielectric constant of silicon dioxide. In some embodiments, the high-k dielectric material has a k value greater than 3.9. In some embodiments, the high-k dielectric material has a k value greater than 8.0. In some embodiments, gate dielectric layer 142 comprises silicon dioxide (SiO$_2$), silicon oxynitride (SiON), hafnium dioxide (HfO$_2$), zirconium dioxide (ZrO$_2$) or other suitable materials. In some embodiments, gate dielectric layer 142 has a thickness ranging from 60 Angstroms (Å) to 80 Å. If the thickness is less than 60 Å, gate dielectric layer 142 will break down if a high voltage is conducted through PMOS transistor 100A, in some embodiments. If the thickness is greater than 80 Å, gate electrode layer 144 cannot efficiently activate charge transfer through a channel region of first well 132, in some embodiments.

Gate electrode layer 144 is disposed over gate dielectric layer 142 and is configured to receive a signal to selectively activate charge transfer through the channel region of first well 132. In some embodiments, gate electrode layer 144 includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. In some embodiments, the conductive material of gate electrode layer 144 is doped or undoped depending on design requirements of field effect transistor devices of an integrated circuit. In some embodiments, gate electrode layer 144 includes a work function layer tuned to have a proper work function for enhanced performance of the field effect transistor devices. Where the field effect transistor device is a PFET, the work function layer includes a p-type work function metal (p-metal), such as TiN, TaN, other p-type work function metal, or combination thereof. In some embodiments, a conductive layer, such as an aluminum layer, is formed over the work function layer, such that the gate electrode includes a work function layer disposed over a gate dielectric layer and a conductive layer disposed over the work function layer.

First heavily doped region 152 has a p-type dopant type and is located at a top surface of first well 132 surrounding gate structure 140. In some embodiments, first heavily doped region 152 is formed by etching first well 132 to form a trench and growing the first heavily doped regions in the trench. In some embodiments, dopants are introduced during the growing of first heavily doped regions 152. In some embodiments, first heavily doped region 152 is doped following completion of the growing process. In some embodiments, first heavily doped region 152 is formed by doping first well 132. In some embodiments, first heavily doped region 152 is formed by ion implantation into first well 132. First heavily doped region 152 has a higher dopant concentration than first well 132. In some embodiments, first heavily doped regions 152 have a dopant concentration ranging from about $1\times10^{16}$ atoms/cm$^3$ to about $1\times10^{18}$ atoms/cm$^3$. If the dopant concentration is below $1\times10^{16}$ atoms/cm$^3$, first heavily doped region 152 does not provide sufficient electrical connection to first well 132, in some embodiments. If the dopant concentration is above $1\times10^{18}$ atoms/cm$^3$, gate structure 140 is unable to effective prevent conduction between first heavily doped region 152 on opposite sides of the gate structure, in some embodiments.

Second heavily doped region 154 and third heavily doped region 156 are similar to first heavily doped region 152, expect that second heavily doped region 154 has an n-type dopant. In some embodiments, a dopant concentration in first heavily doped region 152 is the same as a dopant concentration in at least one of second heavily doped region 154 or third heavily doped region 156. In some embodiments, the dopant concentration in first heavily doped region 152 is different from a dopant concentration in at least one of second heavily doped region 154 or third heavily doped region 156.

Non-conductive regions 160 electrically separate first heavily doped region 152 from second heavily doped region 154. Non-conductive regions 160 also electrically separate second heavily doped region 154 from third heavily doped region 156. In some embodiments, non-conductive regions 160 electrically separate third heavily doped region 156 from sinker well 170. In some embodiments, non-conductive regions 160 are isolation features, such as shallow trench isolation (STI), local oxidation of silicon (LOCOS), or other suitable isolation features. In some embodiments, non-conductive regions 160 are undoped portions of first well 132 or second well 134. In some embodiments, non-conductive regions 160 are formed by etching first well 132 or second well 134 to form an opening and filling the opening with non-conductive material.

Sinker well 170 is electrically connected to double deep well 120 to bias the double deep well. In some embodiments, sinker well 170 is omitted and double deep well 120 is electrically floating. Sinker well 170 comprises n-type dopants. In some embodiments, a dopant species of sinker well 170 is a same dopant species of at least one of first well 132 or second heavily doped region 154. In some embodiments, the dopant species of sinker well 170 is different from the dopant species of at least one of first well 132 or second heavily doped region 154. In some embodiments, sinker well 170 is formed by ion implantation. In some embodiments, an ion implantation energy used to form sinker 170 ranges from about 40 k eV to about 160 k eV. In some embodiments, a dopant concentration of sinker 170 ranges from about from $1\times10^{15}$ atoms/cm$^3$ to about $9\times10^{15}$ atoms/cm$^3$. If the dopant concentration is below $1\times10^{15}$ atoms/cm$^3$, sinker 170 does not provide sufficient electrical connection with double deep well 120, in some embodiments. If the dopant concentration is above $9\times10^{15}$ atoms/cm$^3$, sinker 170 increases current leakage in PMOS transistor 170, in some embodiments.

In some embodiments, back end of line (BEOL) structures such as contacts, inter-layer dielectrics, interconnect structures, are formed over PMOS 100A in order to form a semiconductor device.

Figure 1B:
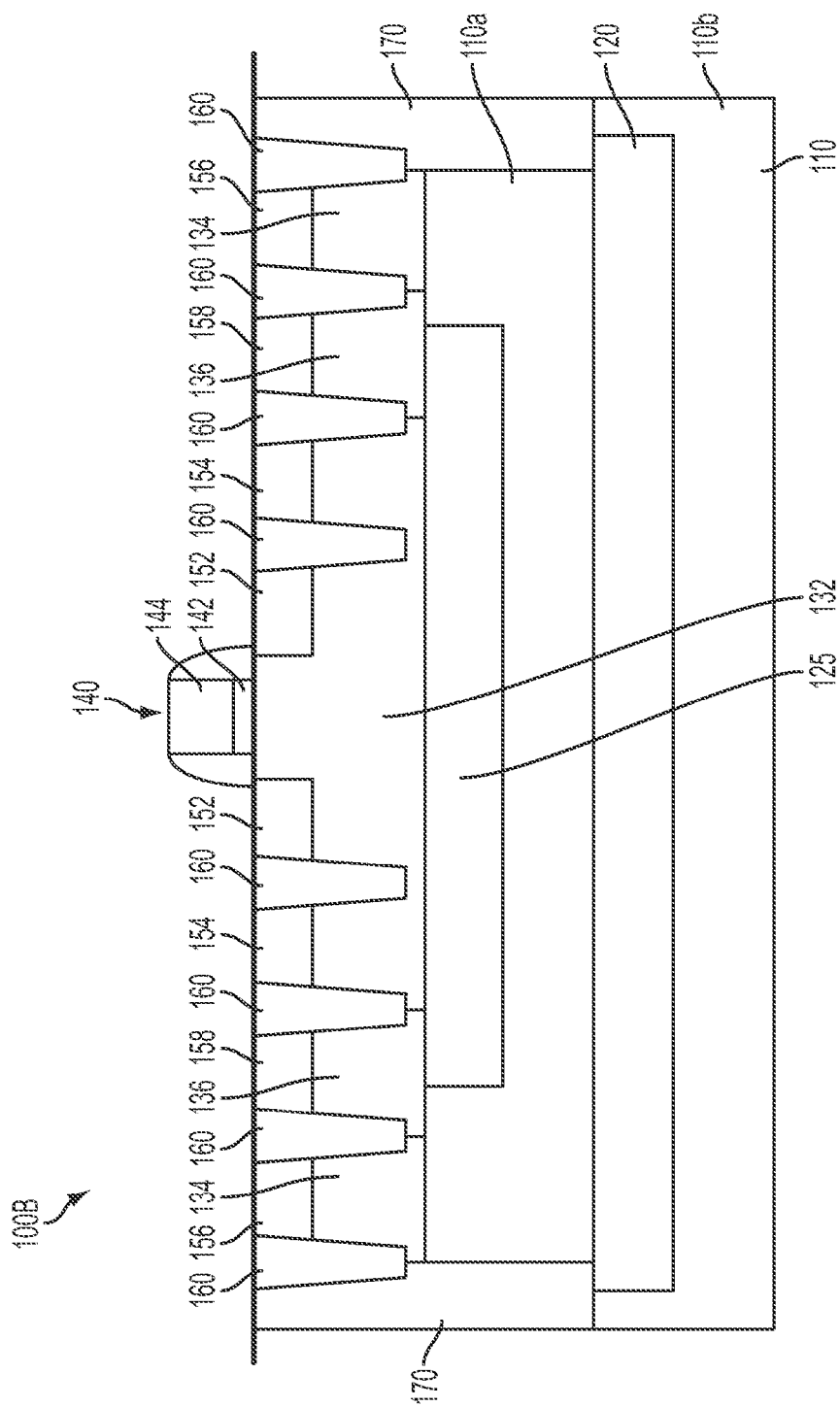
FIG. 1B is a cross-sectional view of an N-type metal oxide semiconductor (NMOS) transistor device having a double deep well in accordance with one or more embodiments.

FIG. 1B is a cross-sectional view of an n-type metal oxide semiconductor (NMOS) transistor device 100B having a double deep well in accordance with one or more embodiments. NMOS transistor 100B includes a substrate 110 having an upper portion 110a and a lower portion 110b. Between the upper portion 110a and lower portion 110b in substrate 110 is a double deep well 120 having an n-type dopant concentration therein. A deep well 125 is in upper portion 110a. Deep well 125 has an n-type dopant. A first well 132 including a p-type dopant type is in substrate 110 above upper portion 110a and deep well 125. A second well 134 is in substrate 110 above upper portion 110a surrounding first well 132. Second well 134 has a p-type dopant. A third well 136 is above upper portion 110a between first well 132 and second well 134. Third well 136 has an n-type dopant. A gate structure 140 is formed over first well 132. A first heavily doped region 152 is in first well 132 surrounding gate structure 140. A second heavily doped region 154 is in first well 132 and surrounds first heavily doped region 152. Non-conductive structures 160 electrically separate first heavily doped region 152 from second heavily doped region 154. A third heavily doped region 156 is in second well region 134 surrounding second heavily doped region 154. Non-conductive structures 160 electrically separate third heavily doped region 156 from second heavily doped region 154. A fourth heavily doped region 158 is in third well 136 between second heavily doped region 154 and third heavily doped region 156. Fourth heavily doped region 158 has an n-type dopant. Non-conductive regions 160 electrically separate fourth heavily doped region 158 from second heavily doped region 154 and from third heavily doped region 156. In some embodiments, a sinker well 170 is in substrate 110 surrounding first well 132; second well 134; and third heavily doped region 156. Sinker well 170 includes n-type dopants. Sinker well 170 is electrically coupled to double deep well 120.

Substrate 110 of NMOS transistor 100B is substantially similar to substrate 110 of PMOS transistor 100A. Similarly, double deep well 120; second well 134; third heavily doped region 156; non-conductive regions 160; and sinker 170 in NMOS transistor 100B are substantially similar to the corresponding elements in PMOS transistor 100A. The structure and formation of first well 132; first heavily doped region 152; and second heavily doped region 154 in NMOS transistor 100B are similar to corresponding elements in PMOS transistor 100B, except that a dopant type is reversed.

Deep well 125 comprises n-type dopants. In some embodiments, the n-type dopants include phosphorus, arsenic or other suitable n-type dopants. In some embodiments, a dopant species of deep well 125 is a same dopant species as double deep well 120. In some embodiments, the dopant species of deep well 125 is different from the dopant species of double deep well 120. In some embodiments, the n-type dopant concentration in deep well 125 ranges from about $1\times10^{13}$ atoms/cm$^2$ to about $3\times10^{13}$ atoms/cm$^2$. In some embodiments, deep well 125 is formed by ion implantation. The power of the ion implantation ranges from about 1000 k eV to about 1500 k eV. In some embodiments, a depth of deep well 125 ranges from about 4 µm to about 6 µm. In some embodiments, a thickness of deep well 125 ranges from about 0.5 µm to about 4 µm. In some embodiments a ratio of a depth of double deep well 120 to a depth of deep well 125 is greater than 1.5. A length of the of deep well 125 in a channel direction of NMOS 100B is less than a length of double deep well 120 in the channel direction of NMOS 100B.

Third well 136 is in substrate 110 surrounding first well 132. Third well 136 includes an n-type dopant. In some embodiments, the n-type dopant comprises phosphorus, arsenic or other suitable n-type dopants. In some embodiments, a dopant species of third well 136 is a same dopant species as at least one of deep well 125 or double deep well 120. In some embodiments, the dopant species of third well 136 is different from the dopant species of at least one of deep well 125 or double deep well 120. In some embodiments, third well 136 comprises an epi-layer grown on upper portion 110a. In some embodiments, the epi-layer is doped by adding dopants during the epitaxial process. In some embodiments, the epi-layer is doped by ion implantation after the epi-layer is formed. In some embodiments, third well 136 is formed by doping substrate 110. In some embodiments, the doping is performed by ion implantation. In some embodiments, third well 136 has a dopant concentration ranging from $1\times10^{12}$ atoms/cm$^3$ to $1\times10^{14}$ atoms/cm$^3$. In some embodiments, third well 136 is electrically coupled to deep well 125 and is usable to bias deep well 125 at a predetermined voltage level. If the dopant concentration is below $1\times10^{12}$ atoms/cm$^3$, third well 136 does not provide sufficient electrical connection with deep well 125, in some embodiments. If the dopant concentration is above $1\times10^{14}$ atoms/cm$^3$, third well 136 would increase current leakage from first well 132 to substrate 110, in some embodiments.

Gate structure 140 of NMOS transistor 100B is similar to gate structure 140 of PMOS transistor 100A, except that in embodiments which include a work function material, the work function material is an n-type work function material. In some embodiments, the n-type work function metal comprises Ta, TiAl, TiAlN, TaCN, other n-type work function metal, or a combination thereof.

Fourth heavily doped region 158 is similar to first heavily doped region 152; expect that the fourth heavily doped region has an n-type dopant. In some embodiments, a dopant concentration in first heavily doped region 152 is the same as a dopant concentration in at least one of second heavily doped region 154; third heavily doped region 156; or fourth heavily doped region 158. In some embodiments, the dopant concentration in first heavily doped region 152 is different from a dopant concentration in at least one of second heavily doped region 154; third heavily doped regions 156; or fourth heavily doped region 158.

In comparison with transistor structures which do not include double deep well 120, PMOS 100A and NMOS 100B have a several serial capacitances which results in a reduced total substrate coupling capacitance. In some embodiments which include sinker well 170, the sinker well is used to supply a bias voltage to double deep well 120 to further control the substrate capacitance. In comparison with a silicon-on-insulator construction, PMOS 100A and NMOS 100B provide greater thermal dissipation. The increased thermal dissipation decreases reliability concerns due to heat related failure of the structure.

Figure 2:
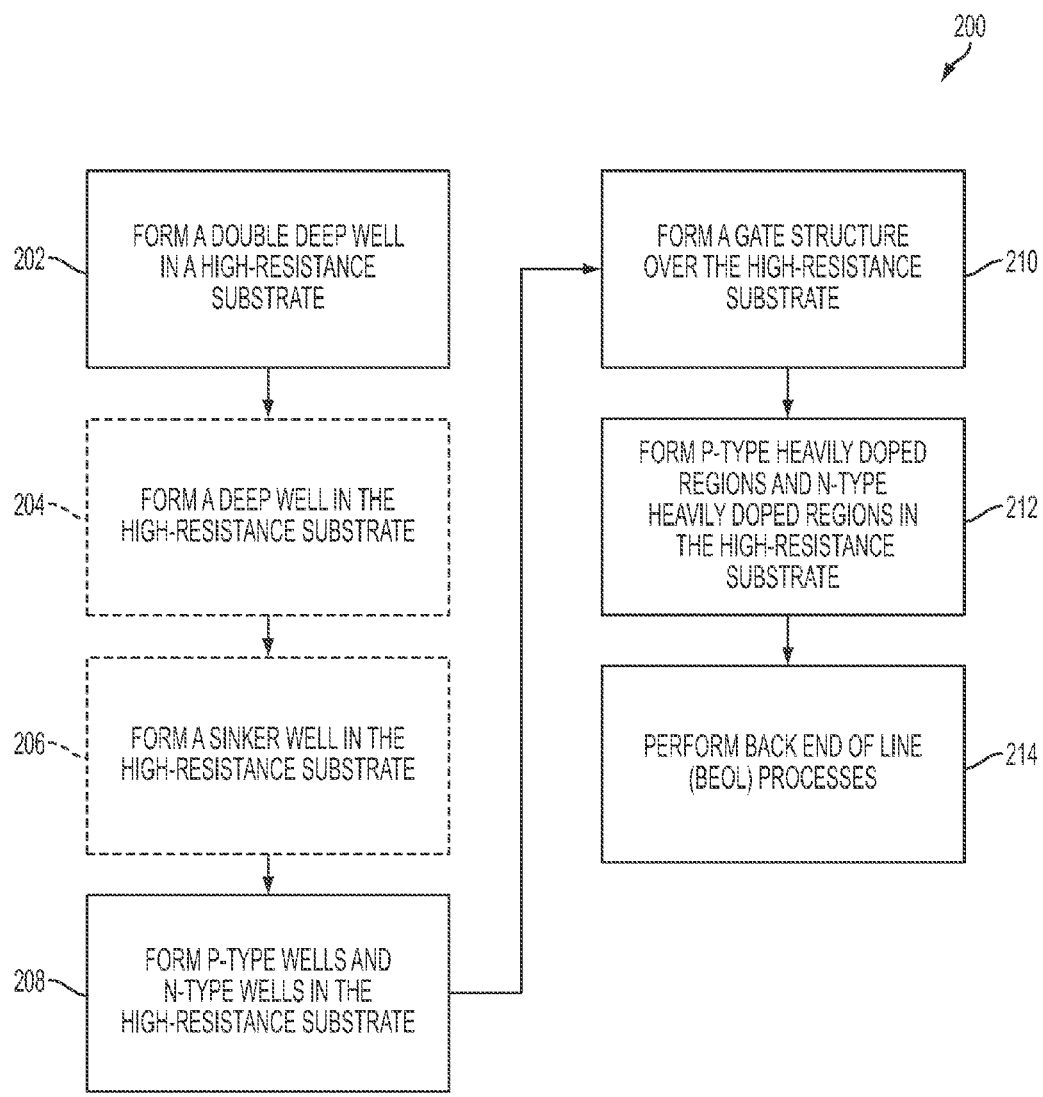
FIG. 2 is a flow chart of a method of manufacturing a semiconductor device in accordance with one or more embodiments.

FIG. 2 is a flow chart of a method 200 of manufacturing a device in accordance with one or more embodiments. Method 200 begins with forming a double deep well, e.g. double deep well 120, in a high-resistance substrate, e.g., substrate 110. The high resistance substrate includes non-conductive regions, e.g., non-conductive regions 160. In some embodiments, the double deep well is formed by depositing a mask 302 (FIGS. 3A-1/3A-2) over a surface of the high-resistance substrate. The mask is then patterned and developed to form an opening. The double deep well is formed by performing ion implantation 304 (FIGS. 3A-1/3A-2) through the opening. In some embodiments, the ion implantation is performed at an energy ranging from about 1500 k eV to about 8000 k eV. In some embodiments, a depth of the ion implantation ranges from about 5 µm to about 10 µm. In some embodiments, the ion implantation continues until a dopant concentration reaches a value of about $1\times10^{12}$ atoms/cm$^3$ to about $1\times10^{14}$ atoms/cm$^3$.

In some embodiments, a first anneal process is performed following the ion implantation process. To prevent significant diffusion of dopants, such as boron, arsenic, phosphorus, etc., the peak anneal temperature should be equal to or less than about 1010° C. for rapid thermal anneal (RTA). The duration of such RTA, or rapid thermal processing (RTP) anneal, is affected by the anneal temperature. For a higher anneal temperature, the anneal time is kept lower. In some embodiments, the RTA duration is equal to or less than about 60 seconds. For example, the anneal process is performed at a temperature in a range from about 750° C. to about 850° C. for a duration in a range from about 5 seconds to about 60 seconds, in accordance with some embodiments. If millisecond anneal (or flash anneal) is used, the peak anneal temperature is higher than the RTA temperature and the duration is reduced. In some embodiments, the peak anneal temperature is equal to or less than about 1250° C. The duration of the millisecond anneal is equal to or less than about 40 milliseconds, in accordance with some embodiments.

Figures 1, 5A:
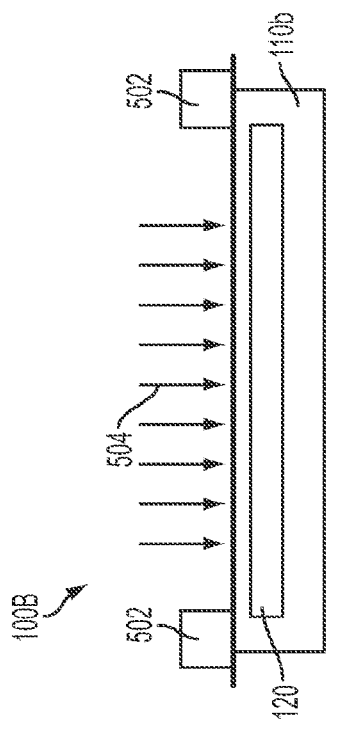

FIGS. 3A-1 and 3A-2 are cross-sectional views of a device following operation 202 in accordance with one or more embodiments. FIG. 3A-1 is a cross-sectional view of an NMOS transistor and FIG. 3A-2 is a cross-sectional view of a PMOS transistor. Both the NMOS transistor and the PMOS transistor include double deep well 120 in substrate 110

Returning to FIG. 2, method 200 continues with optional operation 204 in which a deep well, e.g., deep well 125 is formed in the high-resistance substrate. In some embodiments, operation 204 is omitted when forming a PMOS transistor. In some embodiments, a shape of the deep well is defined by depositing, developing and patterning a mask 312 (FIGS. 3B-1/3B-2) over the high-resistance substrate. The length of the deep well along a direction parallel to a top surface of the substrate is less than the length of the double deep well. The deep well is formed by ion implantation 314 (FIG. 3B-1) through the mask. In some embodiments, the ion implantation is performed at an energy ranging from about 1000 k eV to about 1500 k eV. In some embodiments, the ion implantation continues until a dopant concentration of the deep well reaches a value of about $1\times10^{12}$ atoms/cm$^3$ to about $3\times10^{13}$ atoms/cm$^3$. In some embodiments, a second anneal process is performed following the ion implantation. In some embodiments, the second anneal process is a same anneal process as the first anneal process. In some embodiments, the second anneal process is different from the first anneal process.

FIGS. 3B-1 and 3B-2 are cross-sectional views of a device following operation 204 in accordance with one or more embodiments. The NMOS transistor includes deep well 125 in substrate 110. No deep well is formed in the PMOS transistor, so the structure of the PMOS transistor in FIG. 3B-2 is the same as FIG. 3A-2.

Returning to FIG. 3, method 200 continues with optional operation 206 in which a sinker well is formed in the high-resistance substrate to electrically connect with the double deep well. In some embodiments, the sinker well is formed by depositing, developing and patterning a mask 322 (FIGS. 3C-1/3C-2) over the high-resistance substrate. In some embodiments, the sinker well is formed by performing ion implantation 324 (FIGS. 3C-1/3C-2) through an opening in the mask. In some embodiments, the ion implantation process is performed at an energy ranging from about 40 k eV to about 160 k eV. In some embodiments, the ion implantation process continues until a dopant concentration in the sinker well reaches a value of about $1\times10^{15}$ atoms/cm$^3$ to about $9\times10^{15}$ atoms/cm$^3$.

FIGS. 3C-1 and 3C-2 are cross-sectional views of the device following operation 206 in accordance with one or more embodiments. The NMOS transistor includes sinker well 170 in substrate 110 electrically connected to double deep well 120. Sinker well 170 is spaced from deep well 125. The PMOS transistor includes sinker well 170 in substrate 110 electrically connected to double deep well 120.

Returning to FIG. 2, method 200 continues with operation 208 in which p-type wells and n-type wells are formed in the high-resistance substrate. In some embodiments, p-type wells are formed prior to n-type wells. In some embodiments, n-type wells are formed prior to p-type wells. In some embodiments, all n-type wells are formed simultaneously. In some embodiments, at least one n-type well is formed sequentially with at least another n-type well. In some embodiments, all p-type wells are formed simultaneously. In some embodiments, at least one p-type well is formed sequentially with at least another p-type well.

In some embodiments, the p-type wells and n-type wells are formed by depositing, developing and patterning a mask 332 (FIGS. 3D-1/3D-2) or 342 (FIGS. 3E-1/3E-2) formed over the high-resistance substrate. In some embodiments, the p-type wells and n-type wells are formed by ion implantation 334 (FIGS. 3D-1/3D-2) or 344 (FIGS. 3E-1/3E-2) through the patterned mask. In some embodiments, the ion implantation process continues until a dopant concentration of the p-type well or n-type well independently reaches a value of from $1 \times 10^{14}$ atoms/cm$^3$ to $1 \times 10^{16}$ atoms/cm$^3$.

FIGS. 3D-1 and 3D-2 are cross-sectional views of the device following p-type wells formation in accordance with one or more embodiments. The NMOS transistor includes first well 132 and second well 134 in substrate 110 with a non-p-doped space between the first well and the second well. Second well 134 is adjacent to sinker well 170. The PMOS transistor includes second well 134 adjacent to sinker well 170.

FIGS. 3E-1 and 3E-2 are cross-sectional views of the device following n-type wells formation in accordance with one or more embodiments. The NMOS transistor includes third well 136 between first well 132 and second well 134 in substrate 110. The PMOS transistor includes first well 132 surrounded second well 134.

Returning to FIG. 2, method 200 continues with operation 210 in which a gate structure is formed on the high-resistance substrate. In some embodiments, the gate structure comprises a gate dielectric layer and a gate electrode layer. In some embodiments, the gate structure is formed by chemical vapor deposition (CVD), physical vapor deposition (PVD), atomic layer deposition (ALD), sputtering, or other suitable deposition processes.

FIGS. 3F-1 and 3F-2 are cross-sectional views of the device following operation 210 in accordance with one or more embodiments. Both the NMOS transistor and the PMOS transistor include gate structure 140 over first well 132.

Returning to FIG. 2, method 200 continues with operation 212 in which heavily doped regions are formed in the high-resistance substrate. The heavily doped regions include both p-type heavily doped regions and n-type heavily doped regions. In some embodiments, p-type heavily doped regions are formed prior to n-type heavily doped regions. In some embodiments, n-type heavily doped regions are formed prior to p-type heavily doped regions. In some embodiments, all n-type heavily doped regions are formed simultaneously. In some embodiments, at least one n-type heavily doped region is formed sequentially with at least another n-type heavily doped region. In some embodiments, all p-type heavily doped regions are formed simultaneously. In some embodiments, at least one p-type heavily doped region is formed sequentially with at least another p-type heavily doped region.

In some embodiments, the p-type heavily doped regions and n-type heavily doped regions are formed by depositing, developing and patterning a mask 352 (FIGS. 3G-1/3G-2) or 362 (FIGS. 3H-1/3H-2) formed over the high-resistance substrate. In some embodiments, the p-type heavily doped regions and n-type heavily doped regions are formed by ion implantation 354 (FIGS. 3G-1/3G-2) or 364 (FIGS. 3H-1/3H-2) through the patterned mask. In some embodiments, the ion implantation process continues until a dopant concentration of the p-type heavily doped region or n-type heavily doped region independently reaches a value of from $1 \times 10^{16}$ atoms/cm$^3$ to $1 \times 10^{18}$ atoms/cm$^3$.

FIGS. 3G-1 and 3G-2 are cross-sectional views of the device following p-type heavily doped regions formation in accordance with one or more embodiments. The NMOS transistor includes second heavily doped region 154 in first well 132; and third heavily doped region 156 in second well 134. The PMOS transistor includes first heavily doped region 152 in first well 132; and third heavily doped region 156 in second well 134.

FIGS. 3H-1 and 3H-2 are cross-sectional views of the device following n-type heavily doped region formation in accordance with one or more embodiments. The NMOS transistor includes first heavily doped region 152 in first well 132; and fourth heavily doped region 158 in third well 136. The PMOS transistor includes second heavily doped region 154 in first well 132.

Returning to FIG. 2, method 200 continues with operation 214 in which BEOL processes are performed. In some embodiments, BEOL processes include formation of an inter-layer dielectric (ILD) layer on the high-resistance substrate. Contact holes are formed in the ILD layer. In some embodiments, the contact holes are formed by etching process, such as dry etching or wet etching, or other suitable material removal processes. Conductive contacts are formed in the contact holes to provide electrical connection to the heavily doped regions in the device. In some embodiments, the conductive contacts comprise copper, aluminum, tungsten, a conductive polymer or another suitable conductive material. In some embodiments, a conductive contact is formed in electrical connection with the gate structure. In some embodiments, a conductive contact is formed in electrical contact with the sinker well. In some embodiments, additional interconnect structures are formed over ILD layer to provide electrical connections between the heavily doped regions and other circuitry. In some embodiments, the interconnect structures provide electrical connections between the sinker well and other circuitry. In some embodiments, the interconnect structures provide electrical connections between the gate structure and other circuitry.

FIGS. 3I-1 and 3I-2 are cross-sectional views of devices following operation 214 in accordance with one or more embodiments. In both the NMOS transistor and the PMOS transistor, an ILD layer 372 is over substrate 110. Conductive contacts 374 are formed through ILD layer 372 to provide electrical connection to heavily doped regions 152-156 and to sinker well 170.

Figure 4:
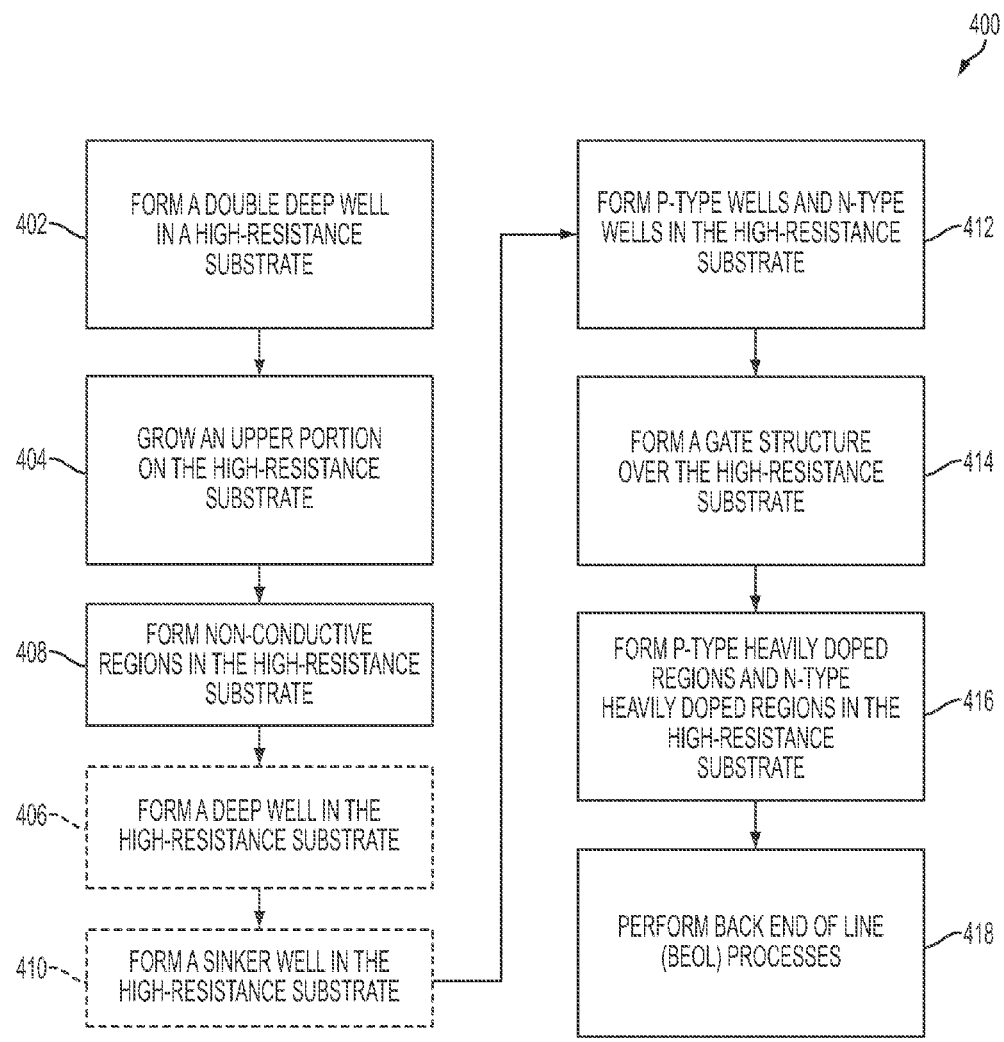
FIG. 4 is a flow chart of a method of manufacturing a semiconductor device in accordance with one or more embodiments.

FIG. 4 is a flow chart of a method 400 of manufacturing a device in accordance with one or more embodiments. Method 400 begins with operation 402 in which a double deep well, e.g., double deep well 120, is formed in a lower portion of a high-resistance substrate, e.g., lower portion 110b. In some embodiments, the double deep well is formed by depositing a mask 502 (FIGS. 5A-1/5A-2) over a surface of the high-resistance substrate. The mask is then developed and patterned to form an opening. The double deep well is formed by performing ion implantation 504 (FIGS. 5A-1/5A-2) through the opening. In some embodiments, the ion implantation is performed at an energy ranging from about 800 k eV to about 1000 k eV. In some embodiments, the ion implantation continues until a dopant concentration reaches a value of about $1 \times 10^{12}$ atoms/cm$^3$ to about $1 \times 10^{14}$ atoms/cm$^3$. In comparison with operation 202, operation 402 has a lower ion implantation energy due to a decreased thickness of the high-resistance substrate into which the double deep well is implanted.

FIGS. 5A-1 and 5A-2 are cross-sectional views of a device following operation 402 in accordance with one or more embodiments. FIG. 5A-1 is a cross-sectional view of an NMOS transistor and FIG. 5A-2 is a cross-sectional view of a PMOS transistor. The NMOS transistor and the PMOS transistor include double deep well 120 in substrate 110

Returning to FIG. 4, method 400 continues with operation 404 in which an upper portion of a high-resistance substrate is grown over the lower portion of the high-resistance substrate. The lower portion of the high-resistance substrate includes the double deep well. In some embodiments, the upper portion is grown over the lower portion using an epitaxial growth process. The upper portion of the high-resistance substrate is grown over the lower portion of the substrate until the double deep well has a depth of about 5 μm to about 10 μm below a top surface of the upper portion of the high-resistance substrate.

Figures 1, 5B:
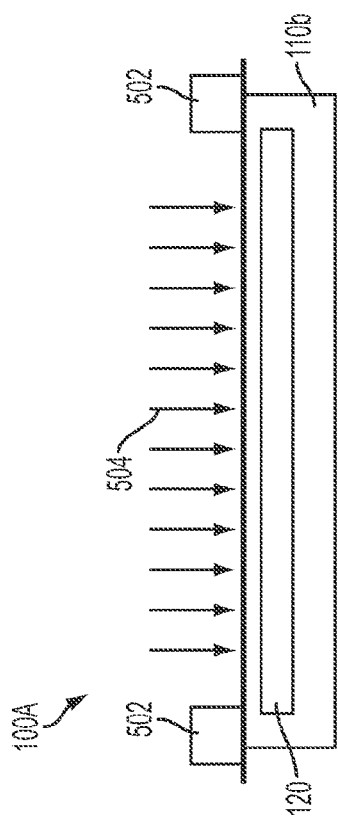
Figures 2, 5A:
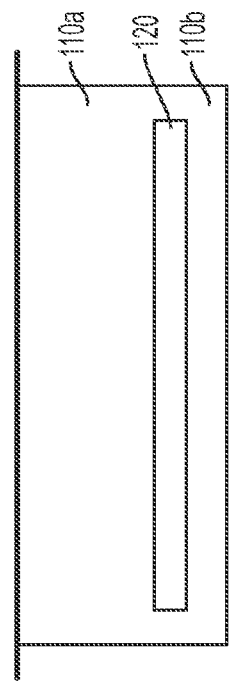
Figures 2, 5B:
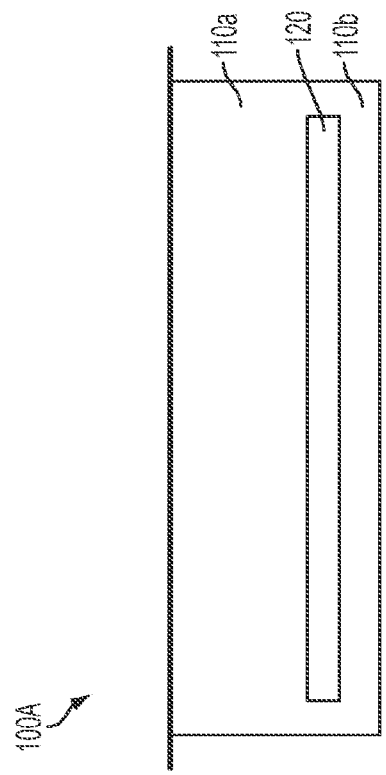

FIGS. 5B-1 and 5B-2 are cross-sectional views of a device following operation 404 in accordance with one or more embodiments. The NMOS transistor and the PMOS transistor include upper portion 110a of the high-resistance substrate grown over lower portion 110b of the high-resistance substrate which already includes double deep well 120.

Returning to FIG. 4, method 400 continues with operation 406 in which non-conductive regions are formed in the upper portion of the high-resistance substrate. In some embodiments, the non-conductive regions are formed by etching the upper portion of the high-resistance substrate to form cavities and filling the cavities with non-conductive materials. In some embodiments, the non-conductive regions are formed by a local oxidation of the upper portion of the high-resistance substrate.

Method 400 continues with optional operation 408 in which a deep well is formed in the upper portion of the high-resistance substrate. In some embodiments, operation 408 is omitted when forming a PMOS transistor. Optional operation 408 is similar to optional operation 204 of method 200.

Figures 2, 5C:
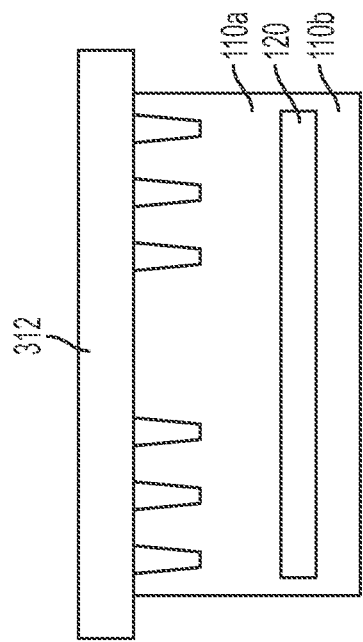
Figures 1, 5C:
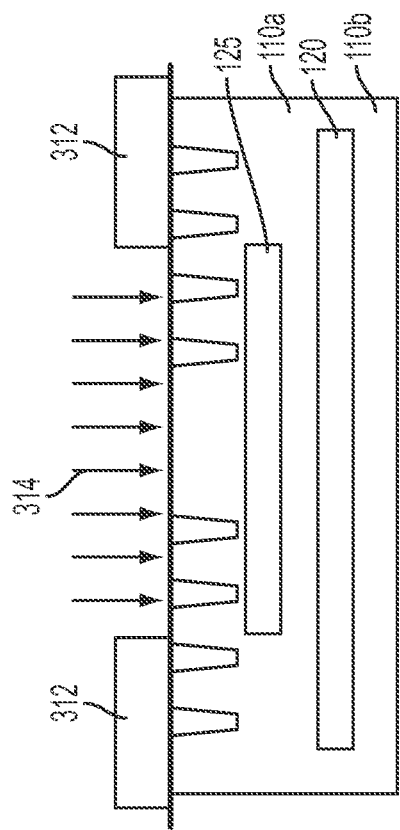

FIGS. 5C-1 and 5C-2 are cross-sectional views of a device following operation 408 in accordance with one or more embodiments. The NMOS transistor includes deep well 125 in the NMOS transistor. No deep well is formed in the PMOS transistor, so the structure of the PMOS transistor in FIG. 5C-2 does not include a deep well. Non-conductive regions 160 are formed in both the PMOS transistor structure and the NMOS transistor structure.

Returning to FIG. 4, method 400 continues with optional operation 410 in which a sinker is formed in the high-resistance substrate. In operation 412, p-type wells and n-type wells are formed in the high-resistance substrate. Method 400 continues with operation 414 in which a gate structure is formed over the high-resistance substrate. In operation 416, p-type and n-type heavily doped regions are formed in the high-resistance substrate. BEOL processes are performed in operation 418. Operations 410-418 are substantially similar to operations 206-214 of method 200. The details of which are not repeated here for the sake of brevity.

In comparison a silicon-on-insulator structure, the process operation of methods 200 and 400 are capable of being integrated into a production process for a complementary metal oxide semiconductor (CMOS). The ability to integrate the production operation into a CMOS production process decreases production costs in comparison with other approaches which require specialized steps.

One aspect of this description relates to a method of forming a semiconductor device. The method includes patterning a first mask over a substrate, wherein the patterned first mask has a first opening, and the substrate include a first dopant type. The method further includes implanting ions having a second dopant type through the first opening into the substrate to form a first deep well. The method further includes patterning a second mask over the substrate, wherein the patterned second mask has a second opening. The method further includes implanting ions having the second dopant type through the second opening into the substrate to form a second deep well, wherein an energy for implanting ions to form the second deep well is lower than an energy for implanting ions to form the first deep well. The method further includes implanting ions having the first dopant type into the substrate to form a first well, wherein the energy for implanting ions to form the second deep well is greater than an energy for implanting ions to form the first well. The method further includes forming a gate structure over the first well.

Another aspect of this description relates to a method of forming a semiconductor device. The method includes implanting ions having a second dopant type into a substrate to form a deep well, wherein the substrate has a first dopant type. The method further includes growing an upper portion over the substrate, wherein the upper portion is over the deep well. The method further includes implanting ions having the first dopant type in the upper portion to form a first well. The method further includes implanting ions having the second dopant type in the upper portion to form a second well, wherein the second well is in contact with the first well. The method further includes forming a gate structure over the first well.

Still another aspect of this description relates to a method of forming a semiconductor device. The method includes implanting ions having a second dopant type in a substrate to form a first deep well, wherein the substrate has a first dopant type. The method further includes implanting ions having the second dopant type in the substrate to form a second deep well, wherein an energy for implanting ions to form the second deep well is less than an energy for implanting ions to form the first deep well. The method further includes implanting ions having the first dopant type in the substrate to form a first well, wherein a dopant concentration in the first well is greater than or equal to a dopant concentration in the first deep well. The method further includes forming a gate structure over the first well.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of forming a semiconductor device, the method comprising:
    patterning a first mask over a substrate, wherein the patterned first mask has a first opening, and the substrate include a first dopant type;
    implanting ions having a second dopant type through the first opening into the substrate to form a first deep well;
    patterning a second mask over the substrate, wherein the patterned second mask has a second opening;
    implanting ions having the second dopant type through the second opening into the substrate to form a second deep well, wherein an energy for implanting ions to form the second deep well is lower than an energy for implanting ions to form the first deep well;
    implanting ions having the first dopant type into the substrate to form a first well, wherein the energy for implanting ions to form the second deep well is greater than an energy for implanting ions to form the first well; and
    forming a gate structure over the first well.

2. The method of claim 1, wherein the energy for implanting ions to form the first deep well ranges from about 1500 k electron volts (eV) to about 8000 k eV.

3. The method of claim 1, wherein the energy for implanting ions to form the second deep well ranges from about 1000 k eV to about 1500 k eV.

4. The method of claim 1, further comprising:
    implanting ions having the second dopant type into the substrate to form a sinker well, wherein the sinker well is over and in contact with the first deep well.

5. The method of claim 1, wherein the energy for implanting ions to form the first deep well comprises forming the first deep well at a first depth, the energy for implanting ions to form the second deep well comprises forming the second deep well at a second depth, and a ratio of the first depth to the second depth is greater than 1.5.

6. A method of forming a semiconductor device, the method comprising:
    implanting ions having a second dopant type into a substrate to form a deep well, wherein the substrate has a first dopant type;
    growing an upper portion over the substrate, wherein the upper portion is over the deep well;
    implanting ions having the first dopant type in the upper portion to form a first well;
    implanting ions having the second dopant type in the upper portion to form a second well, wherein the second well is in contact with the first well; and
    forming a gate structure over the first well.

7. The method of claim 6, further comprising implanting ions in the upper portion and the substrate to form a sinker well, wherein the sinker well contacts the deep well.

8. The method of claim 7, wherein implanting ions to form the sinker well comprises implanting ions in a region of the upper portion surrounding the second well.

9. The method of claim 6, further comprising implanting ions having the second dopant type in the first well to form a first heavily doped region, wherein an energy for implanting ions for forming the first heavily doped region is less than an energy for implanting ions for forming the first well.

10. The method of claim 9, further comprising implanting ions having the first dopant type in the first well to form a second heavily doped region, wherein an energy for implanting ions for forming the second heavily doped region is less than the energy for implanting ions for forming the first well, and the second heavily doped region is between the first heavily doped region and the second well.

11. The method of claim 9, further comprising implanting ions having the second dopant type in the second well to form a third heavily doped region, wherein an energy for implanting ions for forming the third heavily doped region is less than an energy for implanting ions for forming the second well.

12. The method of claim 11, wherein implanting ions to form the third heavily doped region is performed simultaneously with implanting ions to form the first heavily doped region.

13. The method of claim 6, further comprising implanting ions having the second dopant type in the upper portion to form a second deep well, wherein an energy for implanting ions for forming the second deep well is greater than an energy for implanting ions for forming the first well.

14. The method of claim 13, wherein implanting ions to form the second deep well comprises implanting ions to form the second deep well having a width greater than a width of the first well.

15. The method of claim 6, wherein growing the upper portion comprises epitaxially growing the upper portion to have a top surface spaced from a top surface of the deep well by a distance ranging from about 5 μm to about 10 μm.

16. A method of forming a semiconductor device, the method comprising:
    implanting ions having a second dopant type in a substrate to form a first deep well, wherein the substrate has a first dopant type;
    implanting ions having the second dopant type in the substrate to form a second deep well, wherein an energy for implanting ions to form the second deep well is less than an energy for implanting ions to form the first deep well;
    implanting ions having the first dopant type in the substrate to form a first well, wherein a dopant concentration in the first well is greater than or equal to a dopant concentration in the first deep well; and
    forming a gate structure over the first well.

17. The method of claim 16, wherein implanting ions to form the first well comprises implanting ions to form the first well having an interface with the second deep well.

18. The method of claim 16, further comprising implanting ions in the substrate to form a sinker well, wherein the sinker well is connected to the first deep well, and the sinker well surrounds the second deep well.

19. The method of claim 16, further comprising implanting ions having the second dopant type in the substrate to for a second well surrounding the first well, wherein a first portion of the first well contacts a first portion of the second well.

20. The method of claim 19, further comprising forming a non-conductive structure in the substrate, wherein a second portion of the second well is separated from a second portion of the first well by the non-conductive structure.

* * * * *